(12) United States Patent
Kanda et al.

(10) Patent No.: US 10,276,601 B2
(45) Date of Patent: Apr. 30, 2019

(54) DISPLAY DEVICE

(71) Applicant: Japan Display Inc., Minato-ku (JP)

(72) Inventors: Noriyoshi Kanda, Tokyo (JP);
Arichika Ishida, Tokyo (JP);
Masayoshi Fuchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/682,594

(22) Filed: Aug. 22, 2017

(65) Prior Publication Data

US 2018/0061857 A1 Mar. 1, 2018

(30) Foreign Application Priority Data

Aug. 26, 2016 (JP) .................. 2016-165946

(51) Int. Cl.
*H01L 27/12* (2006.01)
*H01L 51/00* (2006.01)
*H01L 51/50* (2006.01)

(52) U.S. Cl.
CPC ........ *H01L 27/124* (2013.01); *H01L 51/0094* (2013.01); *H01L 51/5012* (2013.01); *H01L 27/1203* (2013.01); *H01L 51/0002* (2013.01)

(58) Field of Classification Search
CPC ............... H01L 27/124; H01L 51/5012; H01L 27/1222; G02F 2001/13685; G02F 1/1368; G02F 1/136209
See application file for complete search history.

(56) References Cited

U.S. PATENT DOCUMENTS

2016/0013326 A1* 1/2016 Sun ...................... G02F 1/1368
257/71

FOREIGN PATENT DOCUMENTS

JP 2001-298196 10/2001
JP 2003-338628 11/2003

* cited by examiner

*Primary Examiner* — Marcos D. Pizarro
*Assistant Examiner* — Antonio Crite
(74) *Attorney, Agent, or Firm* — Oblon, McClelland, Maier & Neustadt, L.L.P.

(57) ABSTRACT

According to one embodiment, a display device includes an insulating substrate, a first transistor including a first semiconductor layer of silicon and a first electrode, a first insulating layer provided above the first semiconductor layer, a second transistor including a second semiconductor layer of an oxide semiconductor, a second electrode and a conductive layer electrically connected to the second semiconductor layer, and a second insulating layer provided above the first insulating layer and the second semiconductor layer, the first electrode being electrically connected to the first semiconductor layer in a first hole, and the second electrode being in contact with the conductive layer in a second hole.

14 Claims, 8 Drawing Sheets

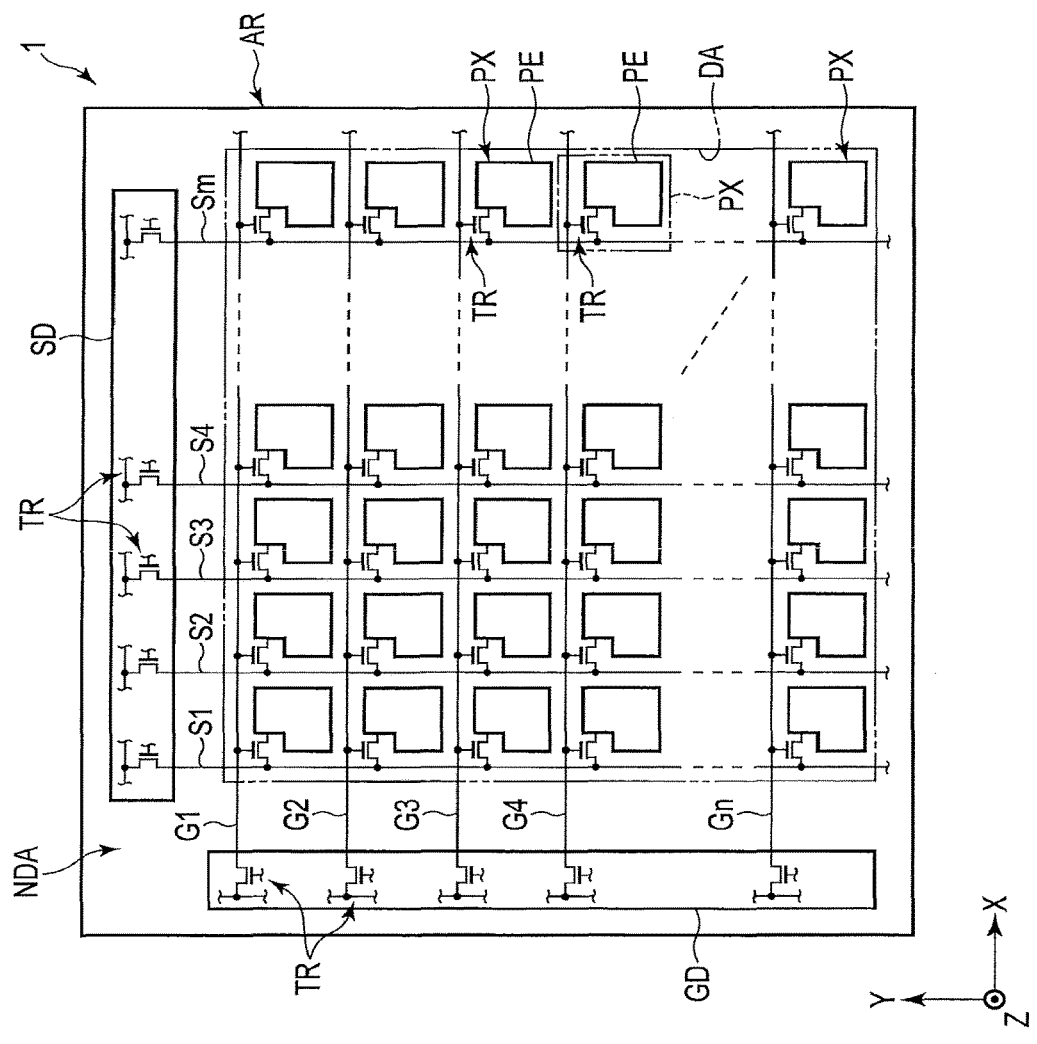
F I G. 1

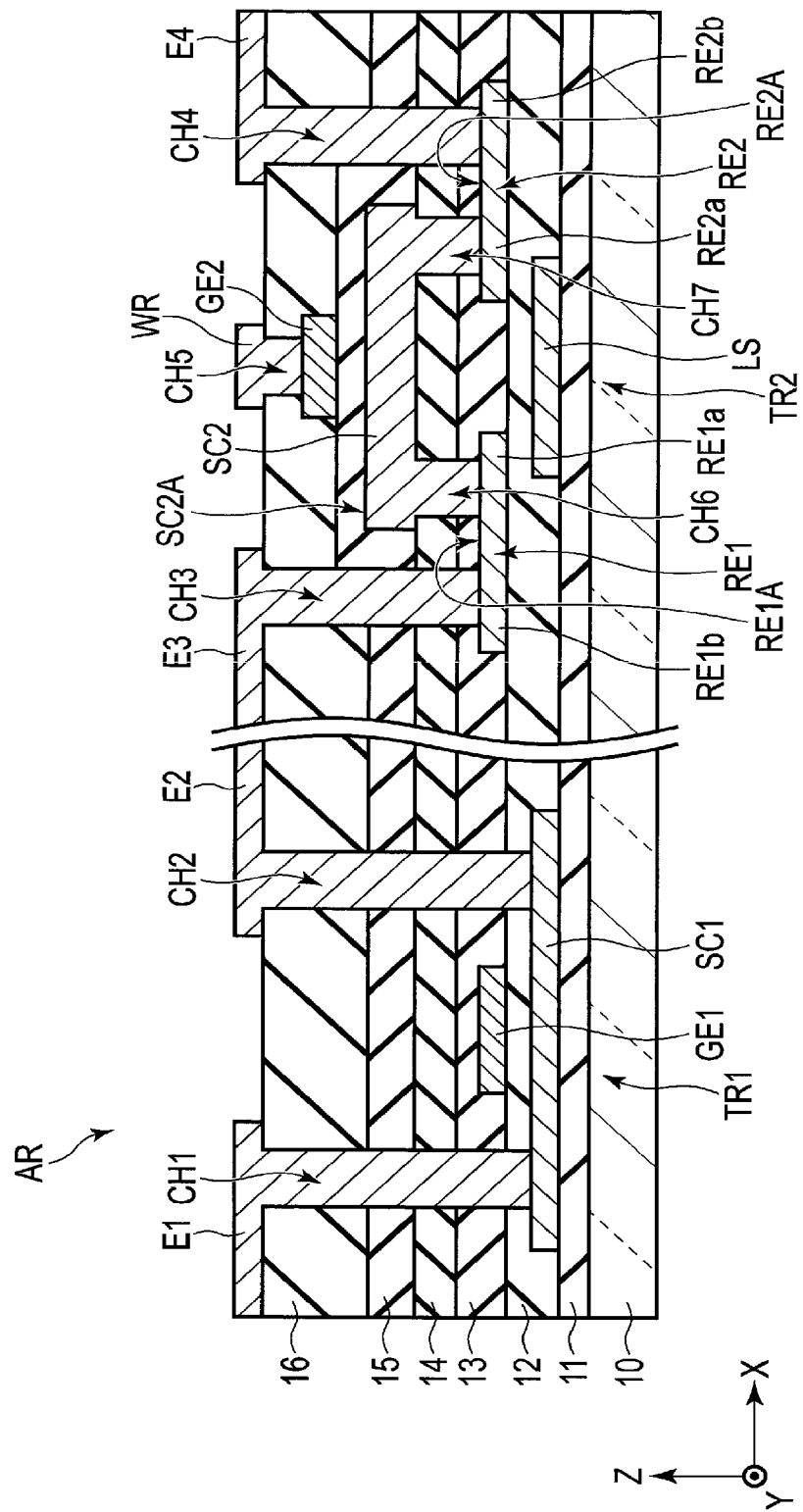
F I G. 2

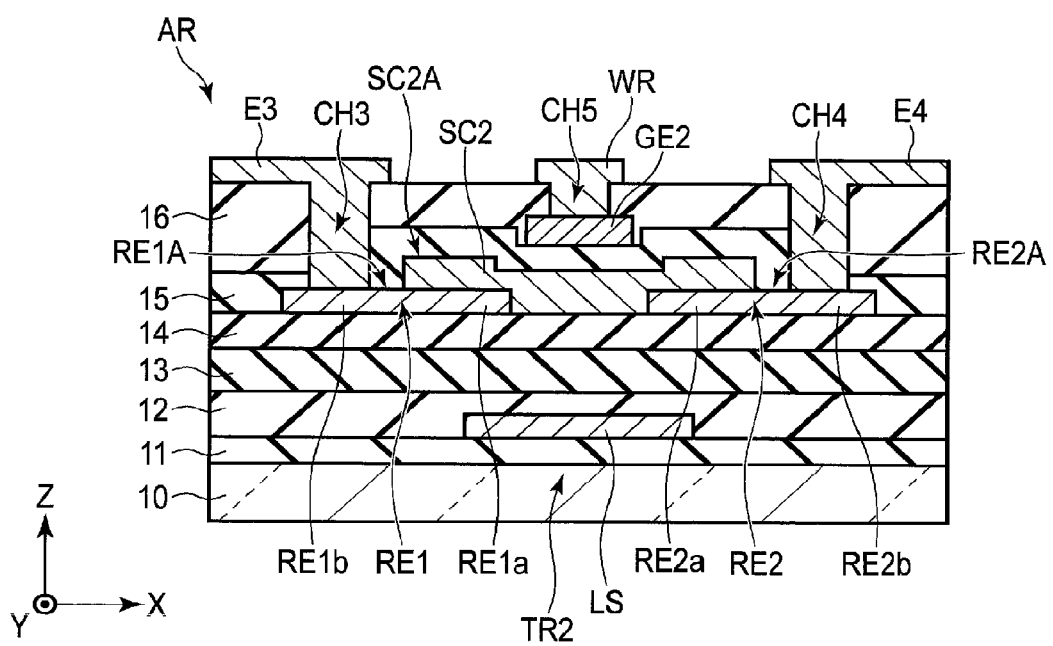
F I G. 3

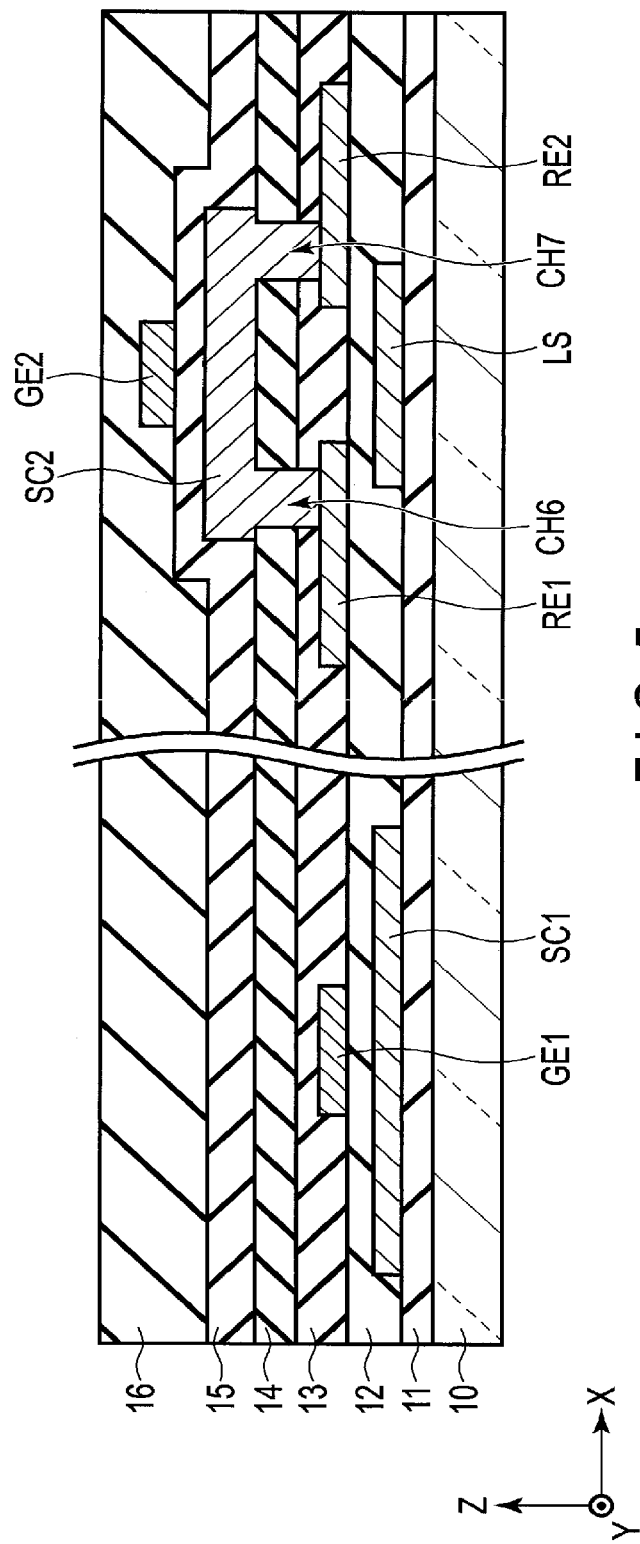
F I G. 5

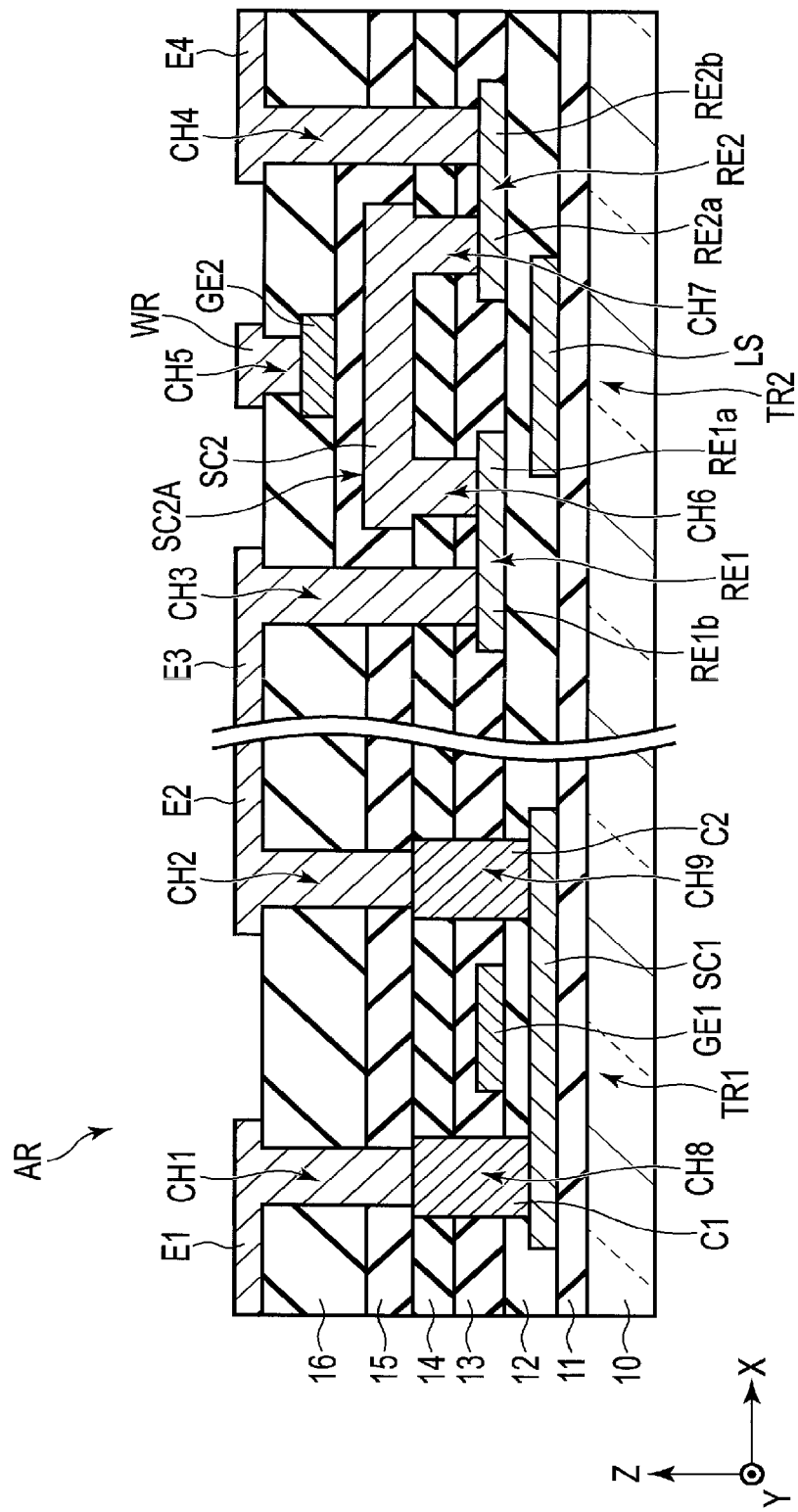
F I G. 8

DISPLAY DEVICE

CROSS-REFERENCE TO RELATED APPLICATIONS

This application is based upon and claims the benefit of priority from Japanese Patent Application No. 2016-165946, filed Aug. 26, 2016, the entire contents of which are incorporated herein by reference.

FIELD

Embodiments described herein relate generally to a display device.

BACKGROUND

Display devices comprise a plurality of pixels for displaying images, a driver for driving the pixels, etc. The pixels and the driver comprise a thin film transistor as a switching element. Such a thin film transistor is, in some cases, constituted by, for example, a polycrystalline semiconductor layer formed from a polycrystalline silicon or an oxide semiconductor layer formed from an oxide.

In recent years, display devices comprising both a thin film transistor including a polycrystalline semiconductor layer and another thin film transistor including an oxide semiconductor layer have been developed. In the thin film transistor including a polycrystalline semiconductor layer, when a contact hole is formed to connect the polycrystalline semiconductor layer and an electrode to each other, an oxide film is, in some cases, formed on a portion of a surface of the polycrystalline semiconductor layer, which is exposed by the contact hole. Therefore, in order to remove the oxide film, a cleaning process using hydrofluoric acid, for example, is carried out in some cases after forming the contact hole.

On the other hand, oxide semiconductor layers have low resistance to hydrofluoric acid and therefore, when exposed to hydrofluoric acid, they are, in some cases, at least partially vanished. For this reason, in the case where a thin film transistor including a polycrystalline semiconductor layer and a thin film transistor including an oxide semiconductor layer are both formed on the same substrate, the electrical characteristics of the thin film transistor with the oxide semiconductor layer are, in some cases, deteriorated by, for example, a cleaning process using hydrofluoric acid, thereby making it difficult to secure the reliability.

BRIEF DESCRIPTION OF THE DRAWINGS

FIG. 1 is a plan view showing a structure and an equivalent circuit of a display device according to the first embodiment.

FIG. 2 is a cross section showing a part of an array substrate of the display device shown in FIG. 1.

FIG. 3 is a cross section showing another example of the display device shown in FIG. 1.

FIG. 5 is a cross section schematically showing a manufacturing step which follows that shown in FIG. 4.

FIG. 8 is a cross section showing a part of an array substrate of a display device according to the second embodiment.

DETAILED DESCRIPTION

Figure 4:
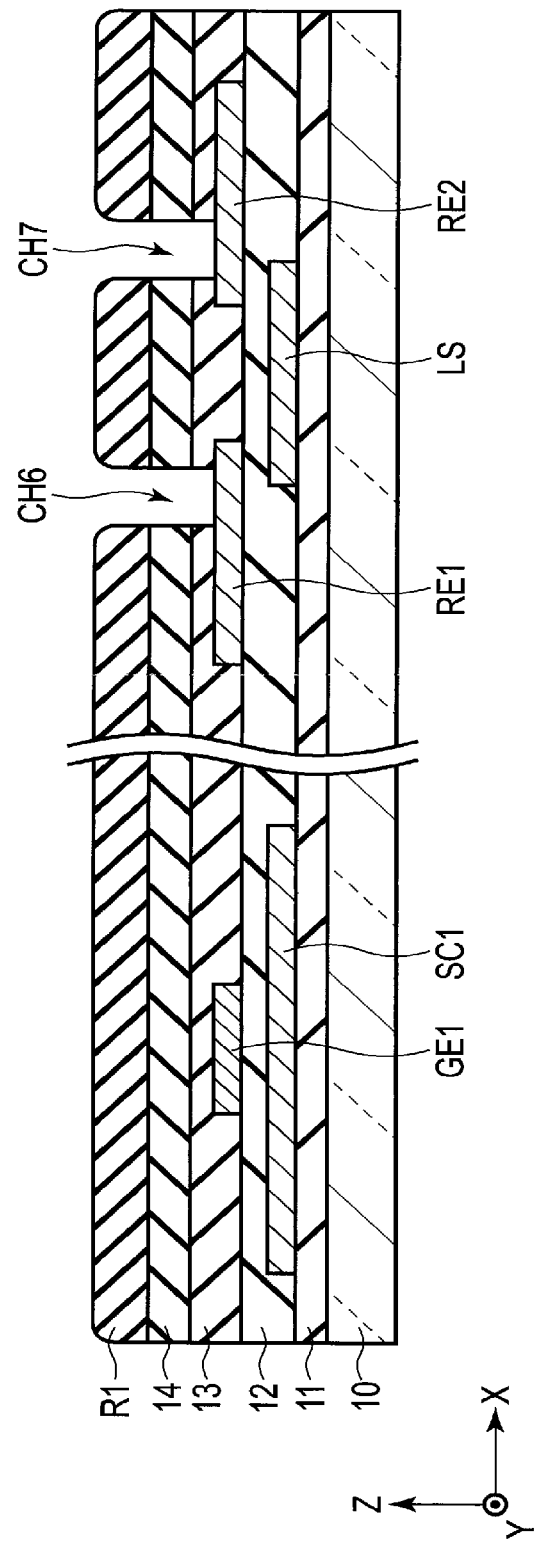
FIG. 4 is a cross section showing an example of the manufacturing process of the display device shown in FIG. 1.

In general, according to one embodiment, a display device comprises an insulating substrate, a first transistor comprising a first semiconductor layer provided above the insulating substrate and a first electrode provided above the first semiconductor layer, a first insulating layer provided above the first semiconductor layer, a second transistor comprising a second semiconductor layer provided above the first insulating layer, a second electrode provided above the second semiconductor layer and a conductive layer located between the second semiconductor layer and the insulating substrate and electrically connected to the second semiconductor layer, and a second insulating layer provided above the first insulating layer and the second semiconductor layer, the first semiconductor layer being formed of silicon, the second semiconductor layer being formed of an oxide semiconductor layer, the first electrode being electrically connected to the first semiconductor layer in a first via-hole which penetrates at least the first insulating layer and the second insulating layer, and the second electrode being in contact with the conductive layer in a second via-hole which penetrates at least the second insulating layer.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

First Embodiment

The display device of this embodiment can be used in, for example, various types of equipment such as smartphones, tablet terminals, mobile telephone terminals, notebook personal computers, and game consoles. The major configuration explained in the present embodiment can also be applied to a liquid crystal device, a self-luminous display device such as an organic electroluminescent display device, an electronic paper display device comprising an electrophoretic element, and the like, a display device employing micro-electromechanical systems (MEMS), or a display device employing electrochromism.

FIG. 1 is a diagram showing a structure and an equivalent circuit of a display device according to the first embodiment.

A first direction X, a second direction Y and a third direction Z illustrated in the figure are orthogonal to each other, but the first direction X and the second direction Y may cross each other at an angle other than 90 degrees. The first direction X and the second direction Y correspond to the directions parallel to the main surface of a substrate which constitutes the display device 1. For example, the first direction X is parallel to short edges of the display device 1, and the second direction Y is parallel to long edges of the display device 1. The third direction Z corresponds to a thickness direction of the display device 1.

In the following explanation, the third direction Z is referred to as upward (or merely above), and an opposite direction to the third direction Z is referred to as downward (or merely below). Further, such expressions as "the second member above the first member" and "the second member below the first member", the second member may be in contact with the first member or may be separated from the first member. In the case of the latter, the third member may be interposed between the first member and the second member. On the other hand, such expression as "the second member on the first member" and "the second member under the first component", the second member is in contact with the first member.

FIG. 1 shows a plane parallel to an X-Y plane defined by the first direction X and the second direction Y.

As shown in FIG. 1, the display device 1 comprises a display area (active area) DA which displays images and a non-displaying area (frame area) on an outer side of the display area DA. The display device 1 is configured from an array substrate AR. The array substrate AR includes n scanning lines G (G1 to Gn), m signal lines S (S1 to Sm) and pixels arranged in an m×n matrix. Each pixel PX is partitioned by two adjacent scanning lines G and two adjacent signal lines S.

The scanning lines G extend in, for example, the first direction X. The signal lines S extend in, for example, the second direction Y. The signal lines S cross the scanning lines G, for example, substantially perpendicularly. The scanning lines G and the signal lines S may not necessarily extend linearly, but part of the lines may be bent. The scanning lines G and the signal lines S are formed of, for example, molybdenum, chromium, tungsten, aluminum, copper, titanium, nickel, tantalum, silver, or an alloy of any of these. The material is not particularly limited, but it may be formed of some other metal or alloy, or a multilayered body in which any of these are stacked.

Each scanning line G and each signal line S extend not only in the display area DA but also out to the non-display area NDA. Each scanning line G is connected to a scanning line driver GD. Each signal line S is connected to a signal line driver SD.

Each pixel PX comprises a thin film transistor TR, a pixel electrode PE, etc. The thin film transistor TR is electrically connected to the respective scanning line G and the respective signal line S. The pixel electrode PE is electrically connected to the signal line S via the thin film transistor TR. Each pixel PX may comprise two or more thin film transistors TR. To each pixel PX, a signal may be applied via a wiring line other than the scanning line G and the signal line S.

The thin film transistor TR of each pixel PX is switched to a conductive (ON) state or a non-conductive (OFF) state by control signals applied from the scanning line driver GD via the scanning line G. A video signal output from signal line driver SD is applied to the corresponding pixel electrode PE via the signal line S and the conductive-state thin film transistor TR of the pixel.

The scanning line driver GD and the signal line driver SD are formed in the non-display area. The scanning line driver GD and the signal line driver SD each comprise a plurality of thin film transistors TR.

FIG. 2 is a cross section showing a part of the array substrate AR of the display device according to this embodiment, which includes the thin film transistors TR. Here, the cross section taken along the X-Z plane defined by the first direction X and the third direction Z is shown. FIG. 2 illustrates only the main part of the array substrate AR, required for explanation. The thin film transistor TR shown in FIG. 1 is formed from either one of the first transistor TR1 and the second transistor TR2 shown in FIG. 2. Each pixel PX, the scanning line driver GD and the signal line driver SD may comprise both the first transistor TR1 and the second transistor TR2.

The array substrate AR is constituted by a first insulating substrate 10 formed from, for example, a transparent insulating material such as glass or resin. In the example illustrated, the main surface of the first insulating substrate 10 is parallel to the X-Y plane defined by the first direction X and the second direction Y. The array substrate AR comprises a first transistor TR1, a second transistor TR2, an insulating layer 11, an insulating layer 12, an insulating layer 13, an insulating layer 14, an insulating layer 15, an insulating layer 16, etc., on the first insulating substrate 10.

The insulating layers 11, 12, 13, 14, 15 and 16 are stacked on the first insulating substrate 10 in this order. The insulating layer 11, 12, 13, 14 and 15 are each formed from, for example, an inorganic insulating material such as silicon oxide (SiO) or silicon nitride (SiN). The insulating layer 16 may be formed from an inorganic or organic insulating material. The insulating layer 11 may be omitted.

The first transistor TR1 is a top-gate thin film transistor. The first transistor TR1 comprises a first semiconductor layer SC1, a first gate electrode GE1, a first electrode E11 and a second electrode E12.

The first semiconductor layer SC1 is formed on the insulating layer 11. The first semiconductor layer SC1 is formed from, for example, a silicon, more specifically, polycrystalline silicon, that is, a polycrystalline semiconductor. In the region where the first transistor TR1 is formed, the insulating layer 12 covers the first semiconductor layer SC1 and is formed also on the insulating layer 11. The first gate electrode GE1 is formed on the insulating layer 12 in the region which overlaps the first semiconductor layer SC1. The insulating layer 13 covers the first gate electrode GE1 and is formed also on the insulating layer 12.

The first electrode E1 and the second electrode E2 are formed on the insulating layer 16. The first electrode E1 and the second electrode E2 pass through contact holes CH1 and CH2 which penetrate the insulating layers 16, 15, 14, 13 and 12 through to the first semiconductor layer SC1 to be each electrically connected to the first semiconductor layer SC1. In the example illustrated, the first electrode E1 and the second electrode E2 are in direct contact with the first semiconductor layer SC1 in the contact holes CH1 and CH2.

The second transistor TR2 is a top-gate thin film transistor. The second transistor TR2 comprises a second semiconductor layer SC2, a second gate electrode GE2, a third electrode E3, a fourth electrode E4 and relay electrodes (conductive layers) RE1 and RE2.

The second semiconductor layer SC2 is located on the insulating layer 14 to be in contact with the insulating layer 14. The second semiconductor layer SC2 is formed from, for example, an oxide semiconductor layer containing an oxide of at least one of indium (In), gallium (Ga), zinc (Zn) and tin (Sn). The second semiconductor layer SC2 is formed from, for example, a transparent amorphous oxide semiconductor (TAOS).

In the case where the insulating layer 13 is formed from, for example, a nitride such as silicon nitride, the insulating layer 14 is formed from silicon oxide. With this structure, it is possible to suppress hydrogen contained in the insulating layer 13 from diffusing to the second semiconductor layer SC2 of an oxide semiconductor layer. In this manner, it is possible to suppress the second semiconductor layer SC2 from being reduced, thereby suppressing the fluctuation in electric resistance of the second semiconductor layer SC2.

The relay electrodes RE1 and RE2 are formed below the second semiconductor layer SC2, or specifically, between the second semiconductor layer SC2 and the first insulating substrate 10. In the example illustrated, the relay electrodes RE1 and RE2 are located between the insulating layer 12 and the insulating layer 13, and spaced from each other along the first direction X.

The relay electrodes RE1 and RE2 comprise, respectively, first parts RE1a and RE2a located directly under the region where the second semiconductor layer SC2 is formed, and second parts RE1b and RE2b extending to the outside of the region where the second semiconductor layer SC2 is formed. More specifically, the first part RE1a located on one end side of the relay electrode RE1 along the first direction X overlaps the second semiconductor layer SC2, whereas the second part RE1b located on another end side extends to an opposite side to the first direction X and does not overlap the second semiconductor layer SC2. The second part RE2b located on one end side of the relay electrode RE2 along the first direction X extends along the first direction X and does not overlap the second semiconductor layer SC2, whereas the first part RE2a located in another end side overlaps the second semiconductor layer SC2.

In the case where the relay electrodes RE1 and RE2 are formed between the insulating layer 12 and the insulating layer 13, the relay electrodes RE1 and RE2 can be formed simultaneously with the first gate electrode GE1 of the first transistor TR1. That is, the relay electrodes RE1 and RE2 may be formed from the same material as that of the first gate electrode GE1.

Between the relay electrodes RE1 and RE2 and the second semiconductor layer SC2, the insulating layer 13 and the insulating layer 14 are interposed. The insulating layer 13 covers the relay electrodes RE1 and RE2 and is formed also on the insulating layer 12. The insulating layer 14 is formed on the insulating layer 13. In the region where the second semiconductor layer SC2 and the first part RE1a of the relay electrode RE1 overlap each other, a contact hole CH6 is formed to penetrate the insulating layer 14 and the insulating layer 13 through to the relay electrode RE1. In the region where the second semiconductor layer SC2 and the first part RE2a of the relay electrode RE2 overlap each other, a contact hole CH7 is formed to penetrate the insulating layer 14 and the insulating layer 13 through to the relay electrode RE2. The second semiconductor layer SC2 is formed also in the contact holes CH6 and CH7 so as to be in contact with the relay electrodes RE1 and RE2. Thereby, the second semiconductor layer SC2 and the relay electrodes RE1 and RE2 are electrically connected to each other.

The insulating layer 15 covers the second semiconductor layer SC2 and is formed also on the insulating layer 14. In this embodiment, an entire upper surface SC2A of the second semiconductor layer SC2 is in contact with the insulating layer 15. That is, a via-hole is not formed in the region of the insulating layers 15, which is in contact with the upper surface SC2A of the second semiconductor layer SC2. Although will not be explained in detail, a side surface of the second semiconductor layer SC2 is also brought into contact with the insulating layer 15.

The second gate electrode GE2 is formed on the insulating layer 15 in the region which overlaps the second semiconductor layer SC2. The insulating layer 16 covers the second gate electrode GE2 and is formed also on the insulating layer 15. In the example illustrated, a wiring line WR is formed on the insulating layer 16 immediately above the second gate electrode GE2. The wiring line WR is in contact with the second gate electrode GE2 via the contact hole CH5 which penetrates the insulating layer 16 to the second gate electrode GE2.

The third electrode E3 and the fourth electrode E4 are formed on the insulating layer 16. The third electrode E3 and the fourth electrode E4 pass through contact holes CH3 and CH4 penetrating the insulating layers 16, 15, 14 and 13 to the relay electrodes RE1 and RE2 and are brought into contact with the second part RE1b of the relay electrode RE1 and the second part RE2b of the relay electrode RE2.

In the example illustrated, the third electrodes E3 and the second semiconductor layer SC2 are both in contact with an upper surface RE1A of the relay electrode RE1. The contact holes CH3 and CH6 are spaced from each other along the first direction X. In the example illustrated, the insulating layers 13, 14 and 15 are interposed between the third electrode E3 and the second semiconductor layer SC2 in the first direction X. Similarly, the fourth electrodes E4 and the second semiconductor layer SC2 are both in contact with an upper surface RE2A of the relay electrode RE2. The contact holes CH4 and CH7 are spaced from each other along the first direction X. In the example illustrated, the insulating layers 13, 14 and 15 are interposed between the fourth electrode E4 and the second semiconductor layer SC2 in the first direction X. The upper surfaces RE1A and RE2A are substantially parallel to, for example, the X-Y plane.

The first gate electrode GE1 of the first transistor TR1 and the second gate electrode GE2 of the second transistor TR2 are formed from the same material as that of the scanning lines G shown in FIG. 1, which contains, for example, molybdenum (Mo), tungsten (W), etc. The first electrodes E1, E2, E3 and E4 and the wiring line WR are formed from the same material as that of the signal lines S shown in FIG. 1, and have a multilayer structure in which, for example, titanium (Ti), aluminum (Al) and titanium (Ti) are stacked in this order.

In the example illustrated, a light-shielding layer LS is provided below the second semiconductor layer SC2. The light-shielding layer LS is disposed so as to overlap at least the region between the relay electrode RE1 and the relay electrode RE2 within the region where the light-shielding layer LS overlaps the second semiconductor layer SC2. In the example illustrated, the light-shielding layer LS is provided between the insulating layers 11 and 12, but it may be formed between the first insulating substrate 10 and the insulating layer 11. The light-shielding layer LS can be formed simultaneously with the first semiconductor layer SC1 of the first transistor TR1. That is, the light-shielding layer LS may be formed from the same material as that of the first semiconductor layer SC1.

FIG. 3 is a cross section showing another example of the first embodiment. FIG. 3 shows only the second transistor TR2.

In the example shown in FIG. 3, the relay electrodes RE1 and RE2 are formed on the insulating layer 14. No insulating layer is interposed between the second semiconductor layer SC2 and the relay electrodes RE1 and RE2. That is, the second semiconductor layer SC2 is in direct contact with the relay electrodes RE1 and RE2. The second semiconductor layer SC2 is formed on the first part RE1a of the relay electrode RE1 and the first part RE2a of the relay electrode RE2 and also on the insulating layer 14 between the relay electrode RE1 and the relay electrode RE2. In the example shown in FIG. 3 as well, in the case where the insulating layer 13 is formed from a nitride such as silicon nitride, the insulating layer 14 is formed from silicon oxide.

The third electrode E3 and the fourth electrode E4 pass through the contact holes CH3 and CH4 penetrating the insulating layer 16 and the insulating layer 15 to the relay electrodes RE1 and RE2 to be brought into contact with the second part RE1b of the relay electrode RE1 and the second part RE2b of the relay electrode RE2.

Next, with reference to FIGS. 4 to 7, an example of the method of manufacturing the display device 1 comprising the array substrate AR shown in FIG. 2 will be described.

As shown in FIG. 4, after the insulating layer 11 is formed on the first insulating substrate 10, a polycrystalline semiconductor layer of polycrystalline silicon, for example, is formed. Then, the polycrystalline semiconductor layer is patterned by photolithography and etching and thus the first semiconductor layer SC1 and the light-shielding layer LS are formed. Subsequently, the insulating layer 12 is formed on the first semiconductor layer SC1, the light-shielding layer LS and the insulating layer 11. Next, a first metal layer of a metal material which contains, for example, molybdenum and tungsten, is formed on the insulating layer 12. Then, the first metal layer is patterned by photolithography and etching and thus the first gate electrode GE1 and the relay electrodes RE1 and RE2 are formed.

Subsequently, the insulating layer 13 of, for example, silicon nitride is formed on the first gate electrode GE1, the relay electrodes RE1 and RE2 and the insulating layer 12. Then, the insulating layer 14 of, for example, silicon oxide is formed on the insulating layer 13. Next, the patterned first resist layer R1 is formed on the insulating layer 14, and then subjected to etching using the first resist layer R1 as a mask, thereby forming contact holes CH6 and CH7 which penetrate the insulating layer 14 and the insulating layer 13 to the relay electrodes RE1 and RE2.

Next, as shown in FIG. 5, after the first resist layer R1 is removed, an oxide semiconductor layer is formed on the insulating layer 14, and then the oxide semiconductor layer is patterned by photolithography and etching. Thus, the second semiconductor layer SC2 is formed. At the same time, the oxide semiconductor layer is formed also in the contact hole CH6 and CH7, the second semiconductor layer SC2 is brought into direct contact with the relay electrodes RE1 and RE2. Subsequently, the insulating layer 15 is formed on the second semiconductor layer SC2 and the insulating layer 14. Next, the second metal layer of a metal material containing, for example, molybdenum and tungsten is formed on the insulating layer 15. Then, the second metal layer is patterned by photolithography and etching and thus the second gate electrode GE2 is formed. Subsequently, the insulating layer 16 is formed on the insulating layer 15 and the second gate electrode GE2.

Figure 6:
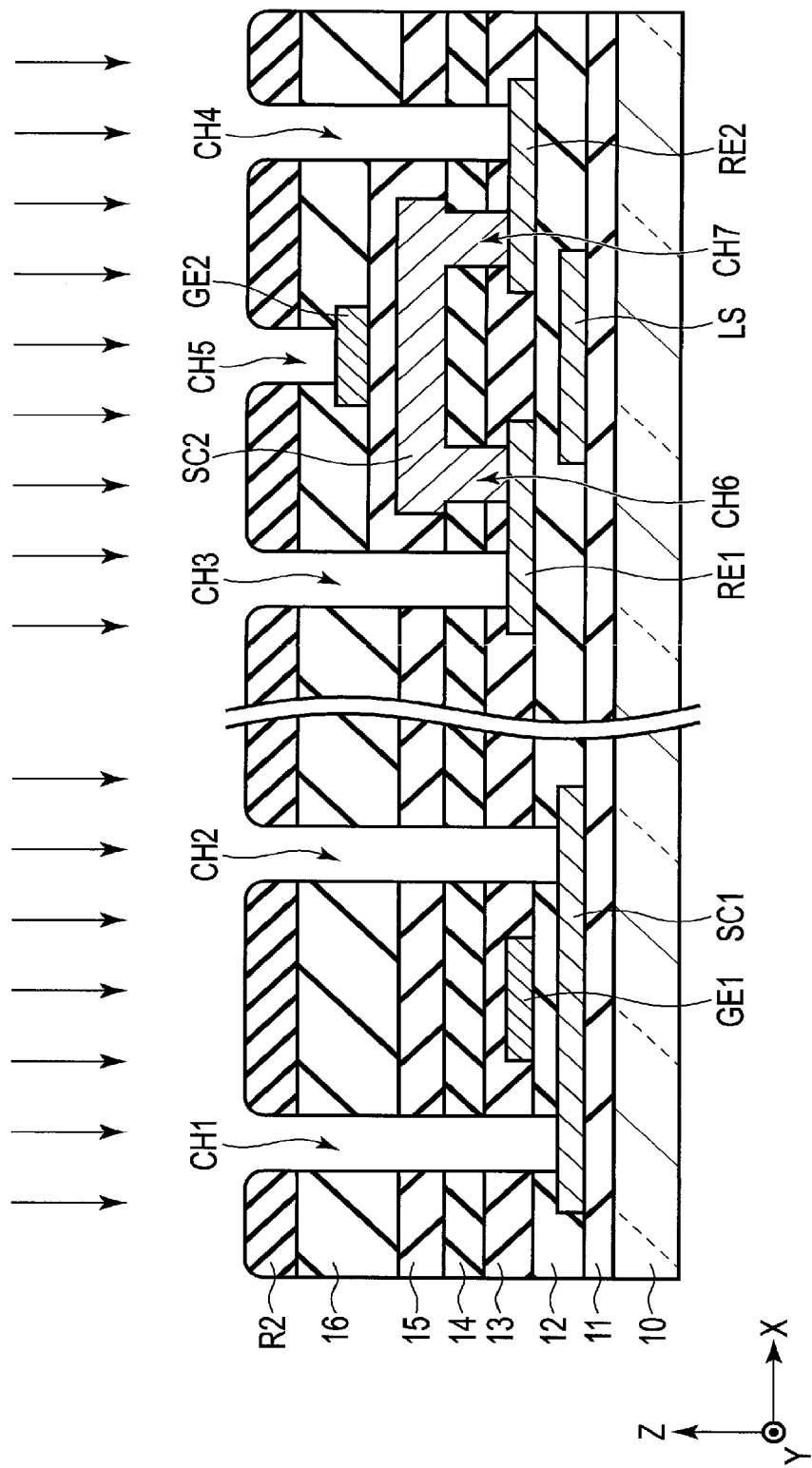
FIG. 6 is a cross section schematically showing a manufacturing step which follows that shown in FIG. 5.

Next, as shown in FIG. 6, the patterned second resist layer R2 is formed on the insulating layer 16, and then subjected to etching using the second resist layer R2 as a mask, thereby forming the contact holes CH1, CH2, CH3, CH4 and CH5. That is, in the region wherein the first semiconductor layer SC1 is formed, the contact holes CH1 and CH2 which penetrate the insulating layers 16, 15, 14, 13 and 12 to the first semiconductor layer SC1 are formed. In the region where the relay electrodes RE1 and RE2 are formed, the contact holes CH3 and CH4 which penetrate the insulating layers 16, 15, 14 and 13 to the relay electrodes RE1 and RE2 are formed. In the region where the second gate electrode GE2 is formed, the contact hole CH5 which penetrates the insulating layer 16 to the second gate electrode GE2 is formed. Here, an oxide film may be formed on the surface of the first semiconductor layer SC1.

Subsequently, the surface of the first semiconductor layer SC1 exposed by the contact holes CH1 and CH2 is cleaned, for example, using hydrofluoric acid (HF). Thus, the oxide film formed on the surface of the first semiconductor layer SC1 is removed, and the increase in electric resistance between the first electrode, the second electrode and the first semiconductor layer SC1 to be connected each other in a later step is suppressed. When the cleaning, the relay electrodes RE1 and RE2 exposed via the contact holes CH3 and CH4 and the second gate electrode GE2 exposed via the contact hole CH5 are exposed to hydrofluoric acid. However, these members are formed from a metal material having higher resistance to hydrofluoric acid as compared to that of the second semiconductor layer SC2, the adverse effect to electric resistance is low.

Figure 7:
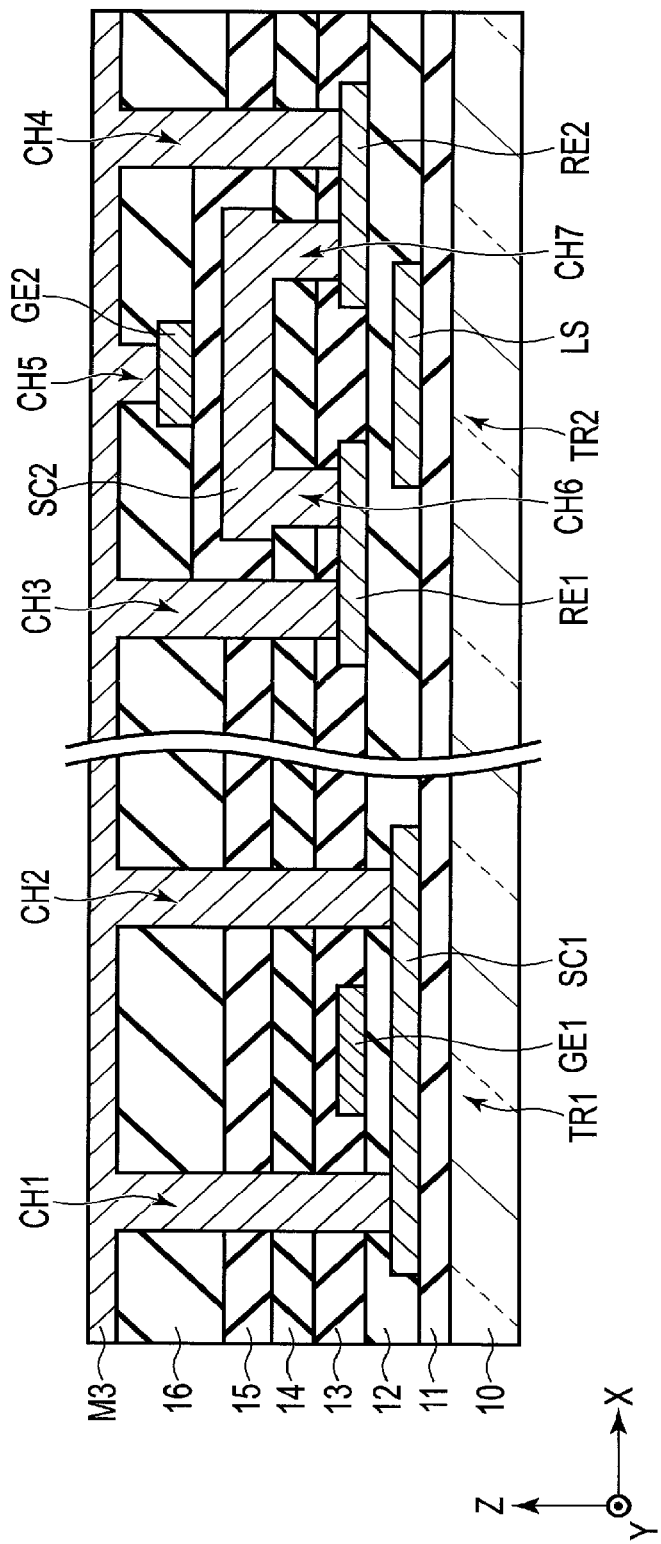
FIG. 7 is a cross section schematically showing a manufacturing step which follows that shown in FIG. 6.

Next, as shown in FIG. 7, after the second resist layer R2 is removed, a third metal layer M3 having a multilayered lamination of, for example, titanium, aluminum and titanium is formed on the insulating layer 16. Thereby, the contact holes CH1, CH2, CH3, CH4 and CH5 are buried under the third metal layer M3. After that, the third metal layer M3 is patterned by photolithography and etching, the first electrode E1, the second electrode E2, the third electrode E3, the fourth electrode E4, and the wiring line WR are formed, and thus the display device 1 shown in FIG. 2 is obtained.

According to this embodiment, the relay electrodes RE1 and RE2 are formed below the second semiconductor layer SC2, the lower surface side of the second semiconductor layer SC2 is in contact with each of the relay electrodes RE1 and RE2, and the third electrode E3 and the fourth electrode E4 are connected to the relay electrodes RE1 and RE2, respectively. That is, the entire upper surface SC2A of the second semiconductor layer SC2 is covered by the insulating layer 15. The contact hole CH3 via which the third electrode E3 passes and the contact hole CH4 via which the fourth electrode E4 passes are formed in the region where the relay electrodes RE1 and RE2 having higher resistance to hydrofluoric acid as compared to that of the second semiconductor layer SC2 are formed.

Therefore, in the case where the first semiconductor layer SC1 having high resistance to hydrofluoric acid and the second semiconductor layer SC2 having low resistance to hydrofluoric acid are formed on the same first insulating substrate 10, even if the contact holes CH3 and CH4 are formed simultaneously with the contact holes CH1 and CH2 and the first semiconductor layer SC1 is subjected to cleaning process using hydrofluoric acid, the second semiconductor layer SC2 is not exposed to hydrofluoric acid and the damage to the second semiconductor layer SC2 can be avoided. Thus, the electrical characteristics of the second transistor TR2 comprising the second semiconductor layer SC2 can be stabilized, thereby securing the reliability.

On the other hand, in the comparative example where the contact hole CHX penetrating to the second semiconductor layer SC2 is formed and the third electrode E3 and the fourth electrode E4 are each connected to the second semiconductor layer SC2, the contact hole CHX cannot be formed simultaneously with the contact holes CH1 and CH2, but it needs to be formed after carrying out the cleaning process using hydrofluoric acid. Therefore, according to this embodiment, in contrast to the above-provided comparative example, the contact holes CH1, CH2, CH3 and CH4 can be formed simultaneously, and thus the number of processing steps can be reduced in the manufacture. Accordingly, the manufacturing cost can also be reduced.

Moreover, the relay electrodes RE1 and RE2 can be formed simultaneously with the first gate electrode GE1 of the first transistor TR1. That is, no additional processing step for forming the relay electrodes RE1 and RE2 is needed. Therefore, according to this embodiment, the increase in the number of processing steps can be suppressed.

Second Embodiment

FIG. 8 is a cross section showing a part of an array substrate AR of a display device according to the second embodiment. The second embodiment is different from the first embodiment in that the conductive members C1 and C2 are formed respectively between the first semiconductor layer SC1 and the first electrode E1 and between the first semiconductor layer SC1 and the second electrode E2 in the first transistor TR1.

In the example illustrated, the conductive members C1 and C2 are each brought into contact with the first semiconductor layer SC1 in the contact holes CH8 and CH9 which penetrate the insulating layers 14, 13 and 12 through to the first semiconductor layer SC1. The first electrode E1 and the second electrode E2 are brought into contact with the conductive members C1 and C2, respectively, in the contact holes CH1 and CH2 which penetrate the insulating layer 16 and the insulating layer 15 through to the conductive members C1 and C2.

The contact holes CH8 and CH9 may be formed simultaneously with the contact holes CH6 and CH7 which connect the second semiconductor layer SC2 of the second transistor TR2 to the relay electrodes RE1 and RE2, or they may be formed in separate processing steps. Moreover, the contact holes CH8 and CH9 may penetrate the insulating layer 15. In the case where the contact holes CH8 and CH9 penetrate the insulating layers 15, 14, 13 and 12, the conductive members C1 and C2 can be formed simultaneously with the second gate electrode GE2. That is, the conductive members C1 and C2 may be formed from the same material as that of the second gate electrode GE2.

In this embodiment as well, an advantageous effect similar to that of the first embodiment can be obtained. Further, according to this embodiment, the depth (dimension along the third direction Z) of the contact holes CH1 and CH2 in which the first electrode E1 and the second electrode E2 are provided is less than the depth of the contact holes CH1 and CH2 of the first embodiment. With this structure, the first electrode El and the second electrode E2 are very unlikely to break in the contact holes CH1 and CH2. Thereby, the electrical characteristics of the first transistor TR1 can be stabilized and thus the reliability can be secured.

In the above-described embodiment, the first transistor TR1 corresponds to the first transistor, the first semiconductor layer SC1 corresponds to the first semiconductor layer, the first electrode E1 corresponds to the first electrode, and the first gate electrode GE1 corresponds to the first gate electrode. The second transistor TR2 corresponds to the second transistor, the second semiconductor layer SC2 corresponds to the second semiconductor layer, the third electrode E3 corresponds to the second electrode, the second gate electrode GE2 corresponds to the second gate electrode, and the relay electrode RE1 corresponds to the conductive layer. The insulating layer 12 corresponds to the first insulating layer, the insulating layer 15 corresponds to the second insulating layer, the insulating layer 13 corresponds to the third insulating layer, and the insulating layer 14 corresponds to the fourth insulating layer. The contact hole CH1 corresponds to the first via-hole, contact hole CH3 corresponds to the second via-hole, and contact hole CH6 corresponds to the third via-hole.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
an insulating substrate;
a first transistor comprising a first semiconductor layer provided above the insulating substrate and a first electrode provided above the first semiconductor layer;
a first insulating layer provided above the first semiconductor layer;
a second transistor comprising a second semiconductor layer provided above the first insulating layer, a second electrode provided above the second semiconductor layer and a conductive layer located between the second semiconductor layer and the insulating substrate and electrically connected to the second semiconductor layer; and
a second insulating layer provided above the first insulating layer and the second semiconductor layer,
the first semiconductor layer being formed of silicon,
the second semiconductor layer being formed of an oxide semiconductor layer,
the first electrode being electrically connected to the first semiconductor layer in a first via-hole which penetrates at least the first insulating layer and the second insulating layer, and
the second electrode being in contact with the conductive layer in a second via-hole which penetrates at least the second insulating layer.

2. The display device of claim 1, wherein
the first transistor comprising a first gate electrode provided on the first insulating layer, and
the conductive layer is formed on the first insulating layer and formed from a same material as that of the first gate electrode.

3. The display device of claim 1, wherein
an entire upper surface of the second semiconductor layer is in contact with the second insulating layer.

4. The display device of claim 1, further comprising:
a third insulating layer located between the first insulating layer and the conductive layer;
a fourth insulating layer located between and the third insulating layer and the conductive layer and in contact with the second semiconductor layer,
wherein
the third insulating layer is formed of silicon nitride, and
the fourth insulating layer is formed of silicon oxide.

5. The display device of claim 1, further comprising:
a conductive member located between the first electrode and the first semiconductor layer and in contact with the first electrode and the first semiconductor layer.

6. The display device of claim 1, wherein
the first electrode and the second electrode are formed from a same material.

7. The display device of claim 1, wherein
the second transistor comprises a second gate electrode provided on the second insulating layer.

8. The display device of claim 7, further comprising:
a conductive member located between the first electrode and the first semiconductor layer and in contact with the first electrode and the first semiconductor layer,
wherein
the conductive member is formed from a same material as that of the second gate electrode.

9. The display device of claim 1, further comprising:
a third insulating layer located between the conductive layer and the second semiconductor layer,
wherein
the second semiconductor layer is in contact with the conductive layer in a third via-hole which penetrates at least the third insulating layer.

10. The display device of claim 9, further comprising:
a fourth insulating layer located between the third insulating layer and the second semiconductor layer and in contact with the second semiconductor layer,
wherein
the third insulating layer is formed of silicon nitride, and
the fourth insulating layer is formed of silicon oxide.

11. The display devices of claim 1, wherein
the second semiconductor layer and the second electrode are in contact with an upper surface of the conductive layer.

12. The display device of claim 11, wherein
the second semiconductor layer and the second electrode are spaced from each other along a first direction parallel to the upper surface, and
the second insulating layer is interposed between the second electrode and the second semiconductor layer.

13. The display device of claim 1, further comprising:
a light-shielding layer in a region which overlaps the second semiconductor layer between the conductive layer and the insulating substrate.

14. The display device of claim 13, wherein
the light-shielding layer is formed from a same material as that of the first semiconductor layer.

* * * * *